(12) United States Patent
Taniguchi

(10) Patent No.: US 11,088,669 B2
(45) Date of Patent: Aug. 10, 2021

(54) BAND PASS FILTER

(71) Applicant: Murata Manufacturing Co., Ltd., Nagaokakyo (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/866,590

(22) Filed: May 5, 2020

(65) Prior Publication Data

US 2020/0266793 A1    Aug. 20, 2020

Related U.S. Application Data

(63) Continuation of application No. PCT/JP2018/041003, filed on Nov. 5, 2018.

(30) Foreign Application Priority Data

Nov. 22, 2017    (JP) .............................. JP2017-224772

(51) Int. Cl.
    *H03H 7/01*        (2006.01)
    *H03H 7/09*        (2006.01)
    *H03H 1/00*        (2006.01)

(52) U.S. Cl.
    CPC ........ *H03H 7/0115* (2013.01); *H03H 7/0161* (2013.01); *H03H 7/09* (2013.01); *H03H 7/1758* (2013.01); *H03H 7/1766* (2013.01); *H03H 2001/0085* (2013.01)

(58) Field of Classification Search
    CPC ......... H03H 2001/0085; H03H 7/0115; H03H 7/09; H03H 7/1766; H03H 7/1758
    USPC .................................................. 333/175, 185
    See application file for complete search history.

(56) References Cited

U.S. PATENT DOCUMENTS

| 6,529,102 | B2* | 3/2003 | Masuda ................... H03H 3/00 333/176 |
| 2002/0030561 | A1 | 3/2002 | Masuda et al. |
| 2012/0319801 | A1 | 12/2012 | Taniguchi |
| 2017/0331444 | A1 | 11/2017 | Mori |
| 2018/0041182 | A1 | 2/2018 | Nishida et al. |
| 2018/0115295 | A1 | 4/2018 | Masuda |
| 2020/0014341 | A1* | 1/2020 | Honda ..................... H03H 7/38 |

FOREIGN PATENT DOCUMENTS

| JP | 61-13706 A | 1/1986 |
| JP | 10-200357 A | 7/1998 |
| JP | 2002-094349 A | 3/2002 |
| JP | 2011-147090 A | 7/2011 |

(Continued)

OTHER PUBLICATIONS

Official Communication issued in International Patent Application No. PCT/JP2018/041003, dated Jan. 15, 2019.

*Primary Examiner* — Rakesh B Patel
(74) *Attorney, Agent, or Firm* — Keating & Bennett, LLP

(57) ABSTRACT

In a band pass filter, a signal input into a first terminal is transmitted to a first LC resonator and a second LC resonator in this order and is then output from a second terminal. The band pass filter includes a third inductor and a third capacitor. A first end of the third inductor is electrically connected to the ground. The third capacitor is electrically connected between a second end of the third inductor and a node between the first LC resonator and the second LC resonator.

11 Claims, 5 Drawing Sheets

(56) References Cited

FOREIGN PATENT DOCUMENTS

| | | |
|---|---|---|
| JP | 2016-092525 A | 5/2016 |
| WO | 2011/114851 A1 | 9/2011 |
| WO | 2016/125515 A1 | 8/2016 |
| WO | 2016/167171 A1 | 10/2016 |
| WO | 2017/014058 A1 | 1/2017 |

\* cited by examiner

100

900

BAND PASS FILTER

CROSS REFERENCE TO RELATED APPLICATIONS

This application claims the benefit of priority to Japanese Patent Application No. 2017-224772 filed on Nov. 22, 2017 and is a Continuation Application of PCT Application No. PCT/JP2018/041003 filed on Nov. 5, 2018. The entire contents of each application are hereby incorporated herein by reference.

BACKGROUND OF THE INVENTION

1. Field of the Invention

The present invention relates to a band pass filter including a plurality of LC resonators.

2. Description of the Related Art

Band pass filters each including a plurality of LC resonators have been known. For example, International Publication No. 2011/114851 discloses a band pass filter including three stages of LC resonators and a ground impedance adjustment circuit. In this band pass filter, an attenuation pole can be provided in an attenuation band near the low-frequency side of a pass band.

Depending on frequency characteristics required for a band pass filter, a case may arise where an attenuation pole is needed near a desired frequency higher than a pass band. However, International Publication No. 2011/114851 does not disclose the concrete configuration with which an attenuation pole is formed near a desired frequency higher than the pass band of a band pass filter.

SUMMARY OF THE INVENTION

Preferred embodiments of the present invention provide attenuation poles near a desired frequency lower than the pass band of a band pass filter and a desired frequency higher than the pass band.

A band pass filter according to a preferred embodiment of the present invention includes a first LC resonator, a second LC resonator, a third inductor, and a third capacitor. The first LC resonator includes a first inductor and a first capacitor electrically connected in parallel with the first inductor. The second LC resonator includes a second inductor and a second capacitor electrically connected in parallel with the second inductor. A first end of the third inductor is electrically connected to a ground. The third capacitor is electrically connected between a second end of the third inductor and a node between the first LC resonator and the second LC resonator. A signal input into a first terminal of the band pass filter is transmitted to the first LC resonator and the second LC resonator in this order and is then output from a second terminal of the band pass filter.

With band pass filters according to preferred embodiments of the present invention, the third capacitor electrically connected between the second end of the third inductor, the first end of which is electrically connected to the ground, and the node between the first LC resonator and the second LC resonator allows attenuation poles to be provided near a desired frequency lower than the pass band of the band pass filter and a desired frequency higher than the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
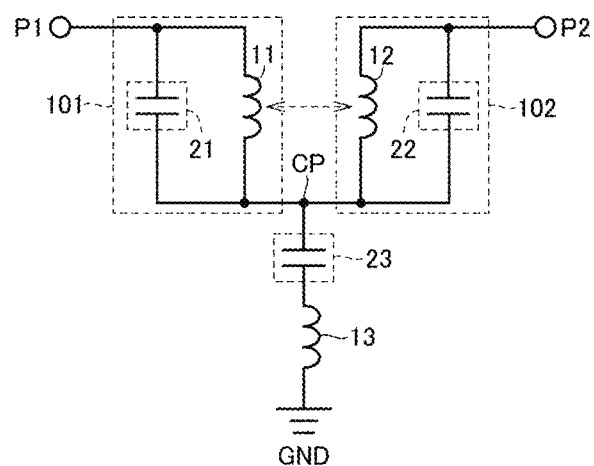
FIG. 1 is an equivalent circuit diagram of a band pass filter according to a first preferred embodiment of the present invention.

Preferred embodiments of the present invention will be described in detail below with reference to the accompanying drawings. In the drawings, the same reference numeral is used to represent the same or similar portion or a corresponding portion so as to avoid repeated explanation.

First Preferred Embodiment

FIG. 1 is an equivalent circuit diagram of a band pass filter 100 according to a first preferred embodiment of the present invention. As shown in FIG. 1, the band pass filter 100 includes terminals P1 and P2, LC resonators 101 and 102, an inductor 13, and a capacitor 23.

The LC resonators 101 and 102 are electrically connected at a node CP. The LC resonator 101 includes an inductor 11 and a capacitor 21. Between the terminal P1 and the node CP, the inductor 11 and the capacitor 21 are electrically connected in parallel with each other. The LC resonator 102 includes an inductor 12 and a capacitor 22. Between the terminal P2 and the node CP, the inductor 12 and the capacitor 22 are electrically connected in parallel with each other. The inductor 11 is magnetically coupled to the inductor 12. Magnetic coupling is coupling via a magnetic flux, and a magnetic flux between inductors changes in accordance with the change in a current flowing through one of the inductors and induced electromotive force is generated at the other one of the inductors.

One end of the inductor 13 is electrically connected to the ground. The capacitor 23 is electrically connected between the other end of the inductor 13 and the node CP.

A signal input into the terminal P1 is transmitted to the LC resonators 101 and 102 in this order and is then output from the terminal P2. A signal input into the terminal P2 is transmitted to the LC resonators 102 and 101 in this order and is then output from the terminal P1.

Figure 2:
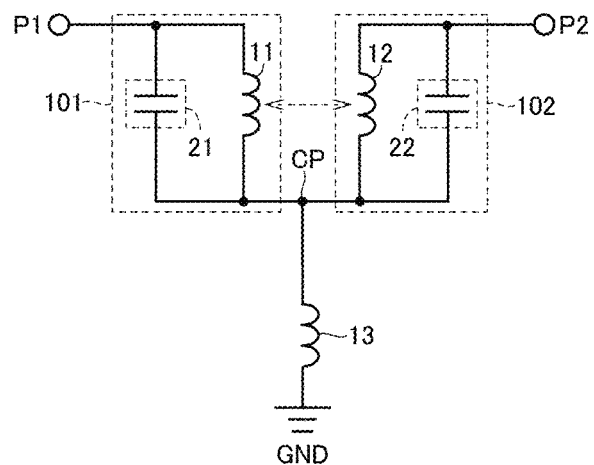
FIG. 2 is an equivalent circuit diagram of a band pass filter that is a comparative example of the first preferred embodiment of the present invention.

FIG. 2 is an equivalent circuit diagram of a band pass filter 900 that is a comparative example of the first preferred embodiment. The equivalent circuit diagram of the band pass filter 900 in FIG. 2 is the same as or similar to the equivalent diagram of the band pass filter 100 in FIG. 1 except that the capacitor 23 is not included. The other features of the band pass filter 900 are the same as or similar to that of the band pass filter 100, and the description thereof is therefore not repeated.

Figure 3:
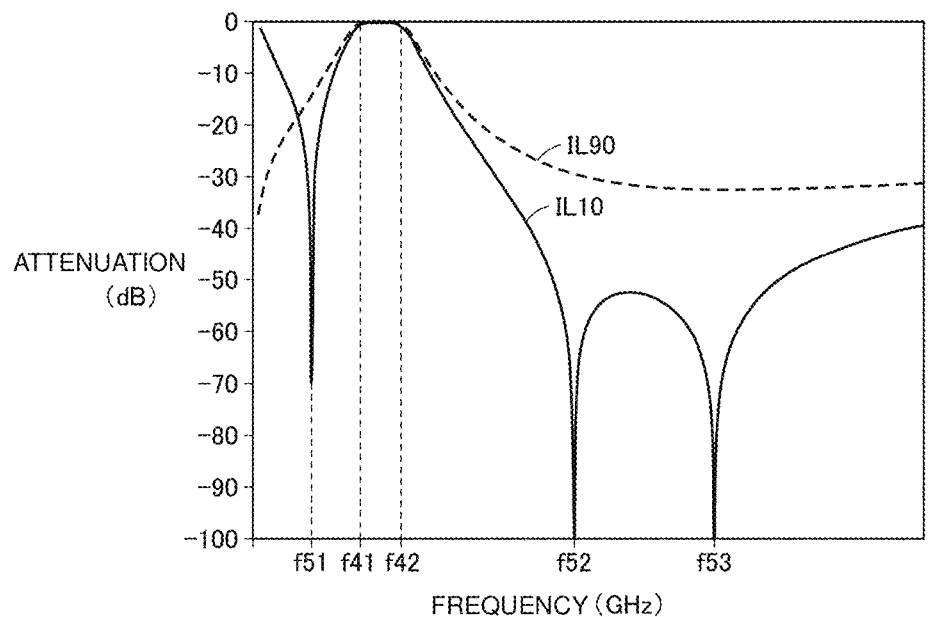
FIG. 3 is a diagram showing the insertion losses of the band pass filters shown in FIGS. 1 and 2.

FIG. 3 is a diagram showing an insertion loss IL10 of the band pass filter 100 in FIG. 1 and an insertion loss IL90 of the band pass filter 900 in FIG. 2. The pass bands of the band pass filters 100 and 900 are preferably the frequency band of f41 to f42 (>f41), for example.

Figure 6:
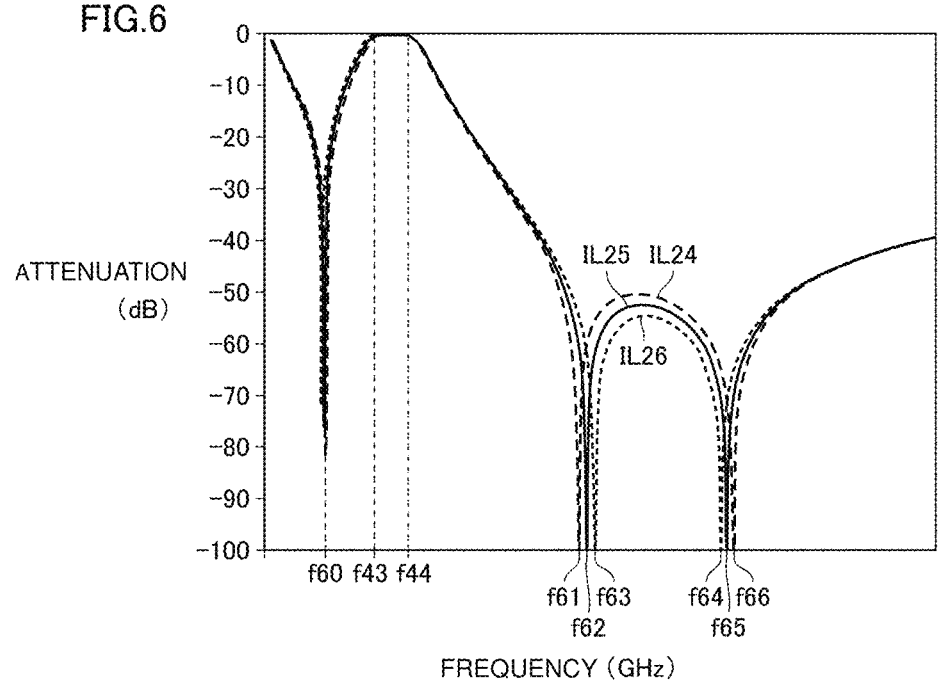
FIG. 6 is a diagram showing the insertion loss of the band pass filter shown in FIG. 5.
Figure 8:
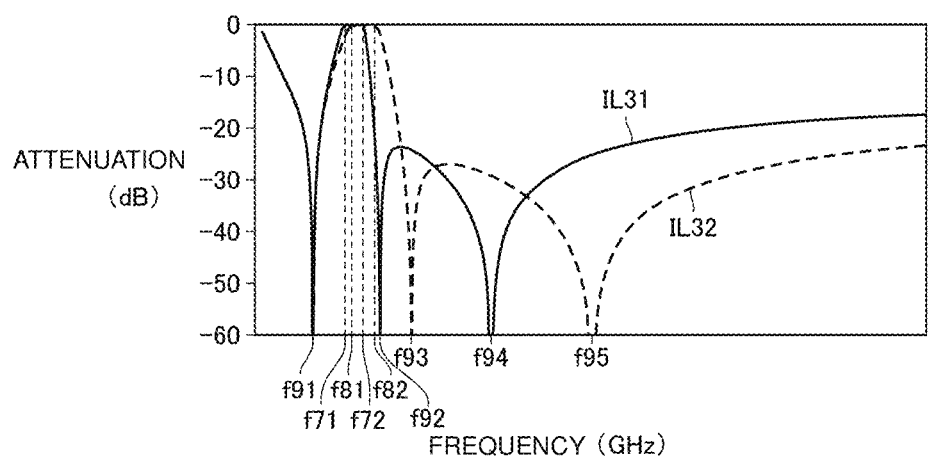
FIG. 8 is a diagram showing the insertion loss of the band pass filter shown in FIG. 7.

In FIG. 3, an attenuation (dB) is represented by a negative value at the vertical axis. The greater the absolute value of an attenuation, the larger the insertion loss. An insertion loss is an indicator representing the proportion of signals transmitted to another terminal of an electronic component in signals input into a certain terminal of the electronic component. The larger the insertion loss, the larger the proportion of signals lost in an electronic component in signals input into the electronic component. The same or similar features and advantageous effects are applicable to FIG. 6 showing a second preferred embodiment and FIG. 8 showing a third preferred embodiment.

Depending on frequency characteristics for a band pass filter, a case may arise where an attenuation pole is needed near a desired frequency outside a pass band. However, in the frequency band shown in FIG. 3, a sufficient attenuation pole is not provided as represented by the insertion loss IL90. On the other hand, attenuation poles are provided at a frequency f51 (<f41), a frequency f52 (>f42), and a frequency f53 (>f52) as represented by the insertion loss IL10.

Regarding the changes in an attenuation in the frequency band of f51 to f41 and the frequency band of f42 to f52, a curve representing insertion loss IL10 is steeper than a curve representing the insertion loss IL90. With the band pass filter 100, attenuation poles are able to be provided at the divided frequency of a pass frequency (e.g., the center frequency of a pass band) and the multiplied frequency of the pass frequency.

The description will be provided below of the mechanism of providing an attenuation pole near a desired frequency in a band pass filter according to a preferred embodiment of the present invention. The higher a frequency f of a signal passing through an inductor having an inductance L, the higher the impedance (L·2πf) of the inductor. The higher a frequency f of a signal passing through a capacitor having a capacitance C, the lower the impedance (1/(C·2πf)) of the capacitor. When a frequency is lower than the pass band of a band pass filter, the impedance of an inductor becomes relatively lower than that of a capacitor as compared with the case of a frequency in a pass band. On the other hand, when a frequency is higher than the pass band of a band pass filter, the impedance of an inductor becomes relatively higher than that of a capacitor as compared with the case of a frequency in a pass band.

Regarding a signal path to a ground GND at the frequency f51, a signal path passing through the inductor 11, the capacitor 23, and the inductor 13 is more predominant than a signal path passing through the capacitor 21, the capacitor 23, and the inductor 13. A signal path passing through the inductor 12, the capacitor 23, and the inductor 13 is more predominant than a signal path passing through the capacitor 22, the capacitor 23, and the inductor 13.

By setting the resonant frequency of a series resonator defined by the inductor 11, the capacitor 23, and the inductor 13 and the resonant frequency of a series resonator defined by the inductor 12, the capacitor 23, and the inductor 13 to frequencies near the frequency f51, an attenuation pole is provided near the frequency f51.

Regarding a signal path to the ground GND at the frequency f53, a signal path passing through the capacitors 21 and 23 and the inductor 13 is more predominant than a signal path passing through the inductor 11, the capacitor 23, and the inductor 13. A signal path passing through the capacitors 22 and 23 and the inductor 13 is more predominant than a signal path passing through the inductor 12, the capacitor 23, and the inductor 13.

By setting the resonant frequency of a series resonator defined by the capacitors 21 and 23 and the inductor 13 and the resonant frequency of a series resonator defined by the capacitors 22 and 23 and the inductor 13 to frequencies near the frequency f53, an attenuation pole is provided near the frequency f53.

Figure 4:
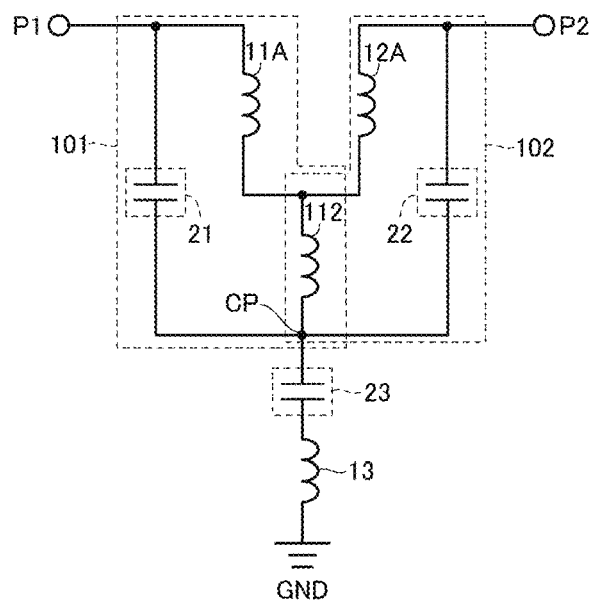
FIG. 4 is another equivalent circuit diagram of a band pass filter according to the first preferred embodiment of the present invention.

Referring to FIGS. 1 and 4, the inductors 11 and 12 that are magnetically coupled to each other in FIG. 1 are replaced with inductors 11A, 12A, and 112 in FIG. 4. Between the terminal P1 and the node CP, the inductor 112 is electrically connected in series with the inductor 11A. Between the terminal P2 and the node CP, the inductor 112 is electrically connected in series with the inductor 12A. The capacitor 21 is electrically connected in parallel with the inductors 11A and 112. The capacitor 22 is electrically connected in parallel with the inductors 12A and 112. The LC resonators 101 and 102 share the inductor 112. By setting the resonant frequency of a parallel resonator defined by the inductor 11A and the capacitor 21 and the resonant frequency of a parallel resonator defined by the inductor 12A and the capacitor 22 to frequencies near the frequency f52, an attenuation pole is provided near the frequency f52.

The frequency f51 is a divided frequency (e.g., about half) of the center frequency of the pass band f41 to f42 of the band pass filter 100. Each of the frequencies f52 and f53 is a multiplied frequency (e.g., about double or about triple) of the center frequency.

With a band pass filter according to the first preferred embodiment, attenuation poles are able to be provided near a desired frequency lower than a pass band and a desired frequency higher than the pass band.

Second Preferred Embodiment

Figure 5:
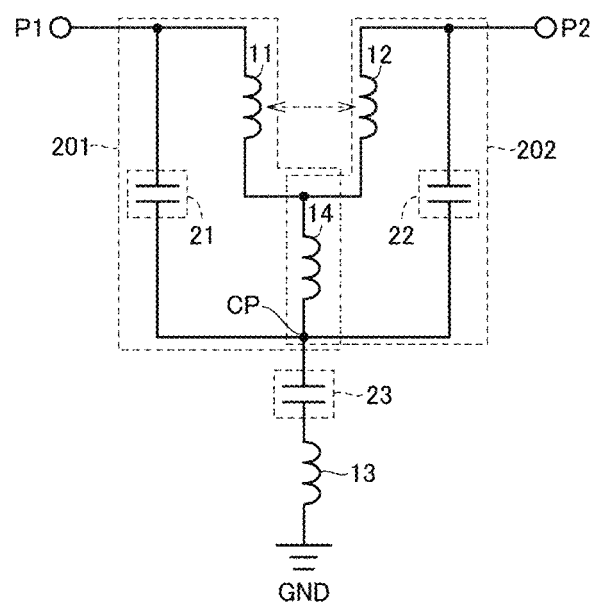
FIG. 5 is an equivalent circuit diagram of a band pass filter according to a second preferred embodiment of the present invention.

FIG. 5 is an equivalent circuit diagram of a band pass filter 200 according to a second preferred embodiment of the present invention. The equivalent circuit diagram of the band pass filter 200 in FIG. 5 is the same as or similar to the equivalent diagram of the band pass filter 100 in FIG. 1 except that an inductor 14 is added and the LC resonators 101 and 102 are replaced with LC resonators 201 and 202, respectively. The other features of the band pass filter 200 are the same as or similar to that of the band pass filter 100, and the description thereof is therefore not repeated.

As shown in FIG. 5, between the terminal P1 and the node CP, the inductor 14 is electrically connected in series with the inductor 11. Between the terminal P2 and the node CP, the inductor 14 is electrically connected in series with the inductor 12. The capacitor 21 is electrically connected in parallel with the inductors 11 and 14. The capacitor 22 is electrically connected in parallel with the inductors 12 and 14.

Since the LC resonators 201 and 202 share the inductor 14 in the second preferred embodiment, the transmission of a signal through physical connection is more predominant than the transmission of a signal through magnetic coupling. The inductors 11 and 12 therefore do not necessarily have to be magnetically coupled to each other.

FIG. 6 is a diagram showing insertion losses IL24 to IL26 of the band pass filter 200 shown in FIG. 5 when the inductance of the inductor 14 is changed in three stages. The inductance of the inductor 14 increases in the order of the insertion losses IL24 to IL26. A frequency at which an attenuation pole is provided increases in the order of frequencies f60 to f66. The pass band of the band pass filter 200 is the frequency band of f43 to f44 (>f43).

As shown in FIG. 6, in a frequency band lower than the pass band of f43 to f44, attenuation poles are provided near the frequency f60 (<f43) in the case of all of the insertion losses IL24 to IL26. In a frequency band higher than the pass band of f43 to f44, attenuation poles are provided at the frequencies f61 and f66 in the case of the insertion loss IL24, attenuation poles are provided at the frequencies f62 and f65 in the case of the insertion loss IL25, and attenuation poles are provided at the frequencies f63 and f64 in the case of the insertion loss IL26. By changing the inductance of the inductor 14, a frequency at which an attenuation pole is provided is able to be changed in a frequency band higher than the pass band of the band pass filter 200.

Changing the inductance of the inductor 14 corresponds to changing the degree of magnetic coupling between the inductors 11 and 12 in FIG. 1 showing the first preferred embodiment as described with reference to FIG. 4. Changing the inductance of the inductor 14 providing a physical connection is more stable and easier than changing the degree of magnetic coupling not providing a physical connection. With a band pass filter according to the second preferred embodiment, the frequency of an attenuation pole is able to be stably and easily changed.

With a band pass filter according to the second preferred embodiment, attenuation poles are able to be provided near a desired frequency lower than the pass band of the band pass filter and a desired frequency higher than the pass band.

Third Preferred Embodiment

Figure 7:
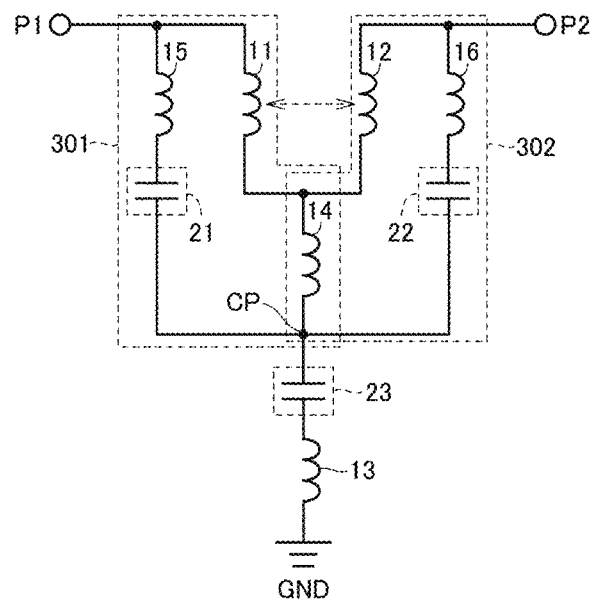
FIG. 7 is an equivalent circuit diagram of a band pass filter according to a third preferred embodiment of the present invention.

FIG. 7 is an equivalent circuit diagram of a band pass filter 300 according to a third preferred embodiment of the present invention. The equivalent circuit diagram of the band pass filter 300 in FIG. 7 is the same as or similar to the equivalent diagram of the band pass filter 200 in FIG. 5 except that inductors 15 and 16 are added. The other features of the band pass filter 300 are the same as or similar to that of the band pass filter 200, and the description thereof is therefore not repeated.

Between the terminal P1 and the node CP, the inductor 15 is electrically connected in series with the capacitor 21. The capacitor 21 is electrically connected between the inductor 15 and the node CP. Between the terminal P2 and the node CP, the inductor 16 is electrically connected in series with the capacitor 22. The capacitor 22 is electrically connected between the inductor 16 and the node CP. The inductance of the inductor 15 is equal or substantially equal to that of the inductor 16, but does not necessarily have to the equal to that of the inductor 16.

FIG. 8 is a diagram showing insertion losses IL31 and IL32 of the band pass filter 300 shown in FIG. 7 when the inductances of the inductors 15 and 16 are changed in two stages. The inductances of the inductors 15 and 16 decrease in the order of the insertion losses IL31 and IL32. A frequency at which an attenuation pole is provided increases in the order of frequencies f91 to f95.

As shown in FIG. 8, the pass band in the case of the insertion loss IL31 is the frequency band of f71 to f72 (>f71). The pass band in the case of the insertion loss IL32 is the frequency band of f81 to f82 (>f81). The frequency f81 is higher than the frequency f71. The frequency f82 is higher than the frequency f72. The pass band in the case of the insertion loss IL32 is moved to be higher than that in the case of the insertion loss IL31.

In the frequency band lower than the pass band, attenuation poles are provided near the frequency f91 in the case of all of the insertion losses IL31 and IL32. In the frequency band higher than the pass band, attenuation poles are provided at the frequencies f92 (>f72) and f94 in the case of the insertion loss IL31 and attenuation poles are provided at the frequencies f93 (>f83) and f95 in the case of the insertion loss IL32. In the frequency band higher than the pass band, the attenuation poles provided at the frequencies f92 and f94 in the case of the insertion loss IL31 are moved to the attenuation poles provided at the higher frequencies f93 and f95, respectively in the case of the insertion loss IL32.

Figure 9:
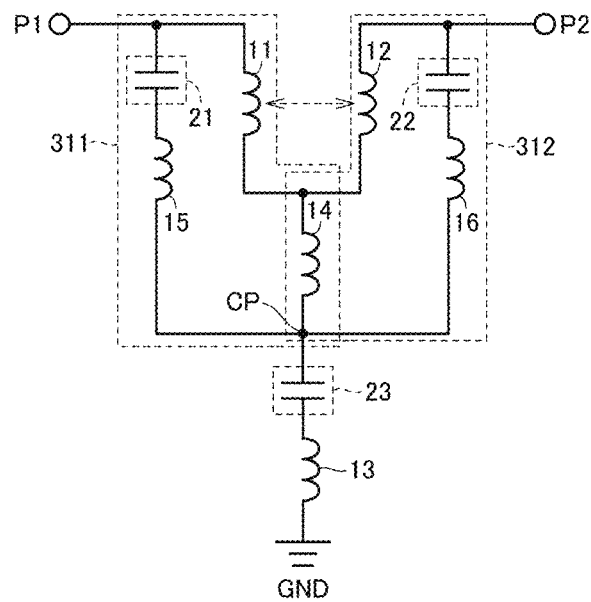
FIG. 9 is an equivalent circuit diagram of a band pass filter that is a first modification of the third preferred embodiment of the present invention.

In the third preferred embodiment, the case has been described where the inductor 15 and the capacitor 21 are electrically connected in series in this order between the terminal P1 and the node CP and the inductor 16 and the capacitor 22 are electrically connected in series in this order between the terminal P2 and the node CP as shown in FIG. 7. The order in which the inductor 15 and the capacitor 21 are electrically connected in series and the order in which the inductor 16 and the capacitor 22 are electrically connected in series may be opposite to those shown in FIG. 7 as shown in the equivalent circuit diagram of a band pass filter 310 that is a first modification of the third preferred embodiment in FIG. 9.

In the case where the capacitors 21 to 23 are electrically connected to one another at the node CP as shown in the equivalent circuit diagram in FIG. 7, one electrodes of the capacitors 21 to 23 electrically connected to the node CP are able to be provided by the same capacitor conductor pattern. Accordingly, in the case where a band pass filter according to a preferred embodiment of the present invention is defined by a laminate including a plurality of dielectric layers, design space is able to be effectively used and the band pass filter is able to be significantly reduced in size by employing the equivalent circuit shown in FIG. 7 rather than the equivalent circuit shown in FIG. 9.

Figure 10:
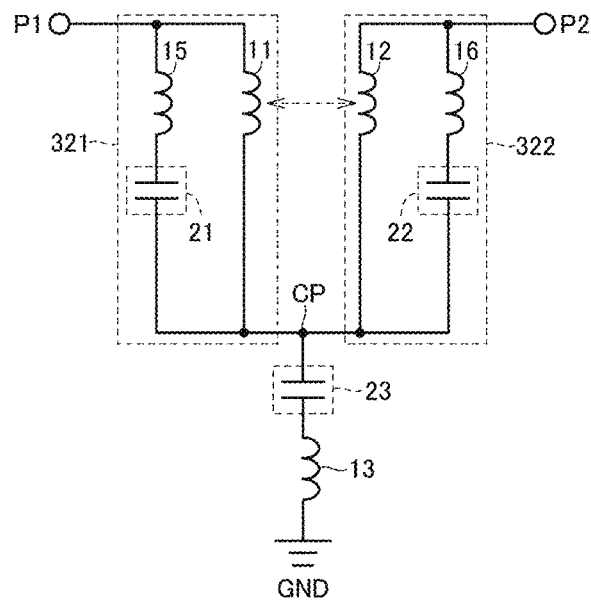
FIG. 10 is an equivalent circuit diagram of a band pass filter that is a second modification of the third preferred embodiment of the present invention.

In the third preferred embodiment, the case has been described where inductors are added in a band pass filter according to the second preferred embodiment to adjust the frequency of an attenuation pole. Inductors that adjust the frequency of an attenuation pole may be added in a band pass filter according to the first preferred embodiment as in a band pass filter 320 that is a second modification of the third preferred embodiment shown in FIG. 10.

With a band pass filter according to the third preferred embodiment and band pass filters that are the first and second modifications, attenuation poles are able to be provided near a desired frequency lower than the pass band of the band pass filter and a desired frequency higher than the pass band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
a first LC resonator including:
a first inductor; and
a first capacitor electrically connected in parallel with the first inductor;
a second LC resonator including:
a second inductor; and
a second capacitor electrically connected in parallel with the second inductor;
a third inductor, a first end of which is electrically connected to a ground; and
a third capacitor electrically connected between a second end of the third inductor and a node between the first LC resonator and the second LC resonator; wherein
a signal input into a first terminal of the band pass filter is transmitted to the first LC resonator and the second LC resonator in this order and is then output from a second terminal of the band pass filter;
the first inductor is magnetically coupled to the second inductor; and
the third capacitor is electrically connected in series with the third inductor.

2. The band pass filter according to claim 1, wherein
the first inductor and the first capacitor are electrically connected in parallel with each other between the first terminal and the node; and
the second inductor and the second capacitor are electrically connected in parallel with each other between the second terminal and the node.

3. The band pass filter according to claim 1, further comprising:
a fourth inductor; wherein
the first LC resonator and the second LC resonator share the fourth inductor;
the fourth inductor is electrically connected in series with the first inductor between the first terminal and the node and is electrically connected in series with the second inductor between the second terminal and the node;
the first capacitor is electrically connected in parallel with the first inductor and the fourth inductor; and
the second capacitor is electrically connected in parallel with the second inductor and the fourth inductor.

4. The band pass filter according to claim 1, wherein
the first LC resonator further includes a fifth inductor electrically connected in series with the first capacitor between the first terminal and the node; and
the second LC resonator further includes a sixth inductor electrically connected in series with the second capacitor between the second terminal and the node.

5. The band pass filter according to claim 4, wherein
the first capacitor is electrically connected between the fifth inductor and the node; and
the second capacitor is electrically connected between the sixth inductor and the node.

6. The band pass filter according to claim 1, wherein no attenuation pole is defined in a frequency band of the band pass filter.

7. The band pass filter according to claim 1, wherein an attention pole is defined at a frequency that is about half of a center frequency of a frequency band of the band pass filter.

8. The band pass filter according to claim 1, wherein an attention pole is defined at a frequency that is about double or about triple of a center frequency of a frequency band of the band pass filter.

9. A band pass filter comprising:
a first LC resonator including:
a first inductor; and
a first capacitor electrically connected in parallel with the first inductor;
a second LC resonator including:
a second inductor; and
a second capacitor electrically connected in parallel with the second inductor;
a third inductor, a first end of which is electrically connected to a ground;
a third capacitor electrically connected between a second end of the third inductor and a node between the first LC resonator and the second LC resonator; and
a fourth inductor; wherein
a signal input into a first terminal of the band pass filter is transmitted to the first LC resonator and the second LC resonator in this order and is then output from a second terminal of the band pass filter;
the first LC resonator and the second LC resonator share the fourth inductor;
the fourth inductor is electrically connected in series with the first inductor between the first terminal and the node and is electrically connected in series with the second inductor between the second terminal and the node;
the first capacitor is electrically connected in parallel with the first inductor and the fourth inductor; and
the second capacitor is electrically connected in parallel with the second inductor and the fourth inductor.

10. A band pass filter comprising:
a first LC resonator including:
a first inductor;
a first capacitor electrically connected in parallel with the first inductor; and
a fifth inductor;
a second LC resonator including:
a second inductor;
a second capacitor electrically connected in parallel with the second inductor; and
a sixth inductor;
a third inductor, a first end of which is electrically connected to a ground; and
a third capacitor electrically connected between a second end of the third inductor and a node between the first LC resonator and the second LC resonator; wherein
a signal input into a first terminal of the band pass filter is transmitted to the first LC resonator and the second LC resonator in this order and is then output from a second terminal of the band pass filter;
the fifth inductor is electrically connected in series with the first capacitor between the first terminal and the node; and
the sixth inductor is electrically connected in series with the second capacitor between the second terminal and the node.

11. The band pass filter according to claim 10, wherein
the first capacitor is electrically connected between the fifth inductor and the node; and the second capacitor is electrically connected between the sixth inductor and the node.

* * * * *